United States Patent
Huynh et al.

(10) Patent No.: US 6,907,332 B1
(45) Date of Patent: Jun. 14, 2005

(54) METHOD AND APPARATUS TO ALIGN AUXILIARY AIRCRAFT EQUIPMENT ATTITUDE AND HEADING

(75) Inventors: Dan Nhan Huynh, Irvine, CA (US); Gary Michael Roth, Lakewood, CA (US); John Edward Cawley, San Pedro, CA (US)

(73) Assignee: The Boeing Company, Chicago, IL (US)

( * ) Notice: Subject to any disclaimer, the term of this patent is extended or adjusted under 35 U.S.C. 154(b) by 105 days.

(21) Appl. No.: 10/645,763

(22) Filed: Aug. 18, 2003

(51) Int. Cl.[7] .............................................. G06F 7/00
(52) U.S. Cl. ...................... 701/36; 701/2; 454/184; 174/50; 174/52.1; 248/27.1; 248/178.1
(58) Field of Search ............................ 701/1, 2, 12, 24, 701/36; 174/50, 52.1; 248/27.1, 178.1; 73/1.78; 244/1 R; 454/184

(56) References Cited

U.S. PATENT DOCUMENTS

| 4,458,296 A | * | 7/1984 | Bryant et al. | ................ 361/691 |
| 4,562,978 A | * | 1/1986 | Durbin et al. | .............. 244/1 R |
| 4,766,517 A | * | 8/1988 | Abell | ......................... 361/691 |
| 5,190,241 A | * | 3/1993 | Pease | ......................... 244/1 R |

* cited by examiner

*Primary Examiner*—Thomas G. Black
*Assistant Examiner*—Arthur D. Donnelly
(74) *Attorney, Agent, or Firm*—Felix L. Fischer

(57) ABSTRACT

Precision alignment of auxiliary equipment on an aircraft is accomplished by a locating tool for the aircraft inertial reference unit (IRU) attached to the auxiliary equipment mount. Aircraft attitude and heading are obtained using the IRU. The IRU is removed from its avionics tray in the aircraft and installed on the locating tool. The locating tool is connected for remote operation of the IRU and the IRU is operated to obtain attitude and heading. This attitude and heading is then compared to the IRU reading for the attitude and heading of the aircraft.

16 Claims, 5 Drawing Sheets

METHOD AND APPARATUS TO ALIGN AUXILIARY AIRCRAFT EQUIPMENT ATTITUDE AND HEADING

BACKGROUND OF THE INVENTION

1. Field of the Invention

This invention relates generally to the field of precision mounting of aircraft auxiliary equipment and, more particularly, to a system employing an aircraft inertial reference unit (IRU) with a remote IRU interface on precision locating tooling for alignment of the auxiliary equipment using the mounting brackets.

2. Description of the Related Art

Auxiliary equipment such as antennas and receiving equipment for various avionics and other subsystems is regularly attached to aircraft during assembly or as a retrofit. Many such systems require precise calibration with respect to overall aircraft heading and attitude for proper operation in the aircraft. Traditional methods of measuring the attitude and heading require expensive external tooling and typically require positioning of the aircraft with respect to an absolute reference. Such external tooling incorporates pitch and roll sensors, laser reflection systems or position receivers such as GPS devices which are expensive and require repetitive periodic tool certification and calibration. Further, the tools must often be aircraft model specific requiring extensive duplication and inventorying of tools. The components of these tools are often prone to damage due to their complexity.

It is therefore desirable to reduce the cost and complexity of interface tooling required for auxiliary equipment heading and attitude alignment. It is further desirable to make use of existing aircraft systems to accomplish alignment relative to those systems without the requirement for aircraft repositioning.

SUMMARY OF THE INVENTION

Precision alignment of auxiliary equipment on an aircraft is accomplished in the present invention by first attaching to the aircraft a mounting bracket or other means intended for mounting the auxiliary equipment to the aircraft. A locating tool is mounted to the bracket and aircraft attitude and heading are obtained using an inertial reference unit (IRU). The IRU is removed from its avionics tray in the aircraft and installed on the locating tool. The locating tool is connected to the avionics tray for remote operation of the IRU and the IRU is operated to obtain attitude and heading. This attitude and heading is then compared to the IRU reading for the attitude and heading of the aircraft.

BRIEF DESCRIPTION OF THE DRAWINGS

These and other features and advantages of the present invention will be better understood by reference to the following detailed description when considered in connection with the accompanying drawings wherein.

DETAILED DESCRIPTION OF THE INVENTION

Most current commercial aircraft rely on an inertial reference system or unit for precise determination of aircraft attitude and heading. The inertial reference unit (IRU) is typically a line replaceable unit (LRU) that is designed for easy installation and removal. Use of the IRU as an aircraft specific tool for alignment of auxiliary equipment to be mounted to the aircraft eliminates the need for additional dedicated and complex tooling for that task.

For alignment of an auxiliary equipment element such as an antenna, a simple, compact mechanical interface assembly is provided which mates with the attachment brackets for the auxiliary equipment. The interface assembly acts as a precision locating tool for the mounting bracket and a remote platform for mounting of the IRU. An extension cable assembly is provided to connect the IRU to its avionics tray in the aircraft when mounted in the interface assembly. The IRU, in its normal mounting in the aircraft avionics tray, is used to obtain heading and attitude for the aircraft. The IRU is then disconnected from its avionics tray and mounted on the interface assembly that has been attached to the auxiliary equipment mounting brackets. The extension cable is attached to the interface assembly and avionics tray to power the IRU and allow the aircraft cockpit displays to read the attitude and heading of the IRU as mounted on the interface assembly. A comparison of the IRU readings from its aircraft mount and interface assembly mount then provide precise alignment information for the auxiliary equipment.

Figure 1:
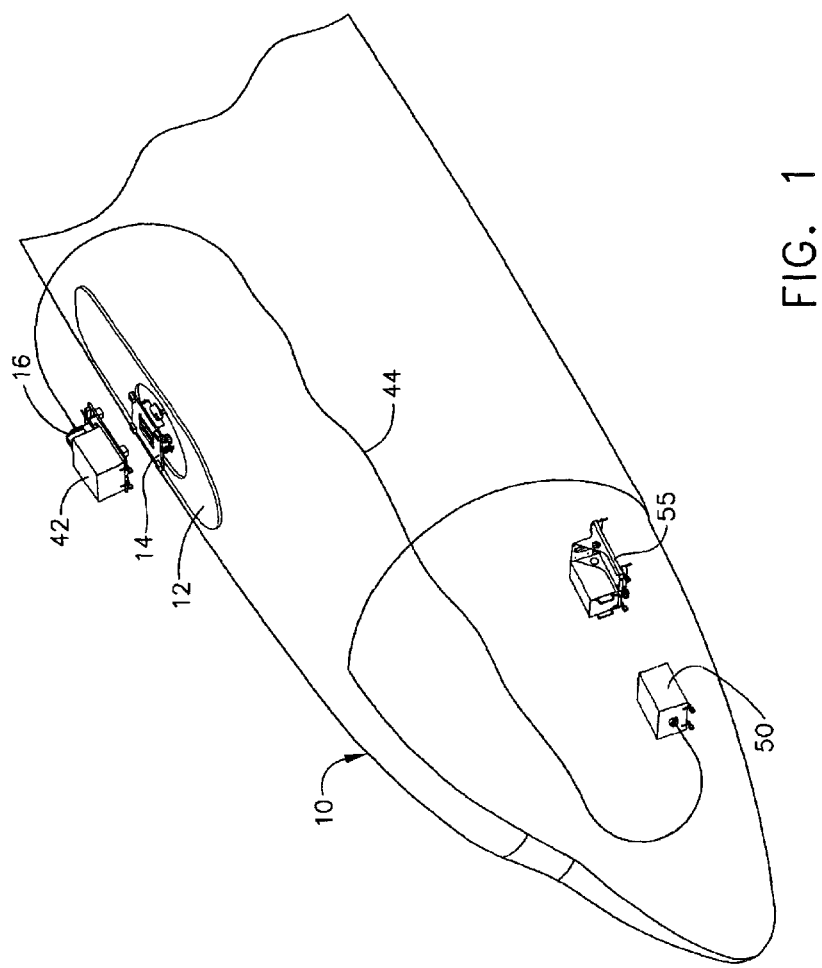
FIG. 1 is a cutaway pictorial view of the forward fuselage of an aircraft showing elements of the invention in use.
Figure 2:
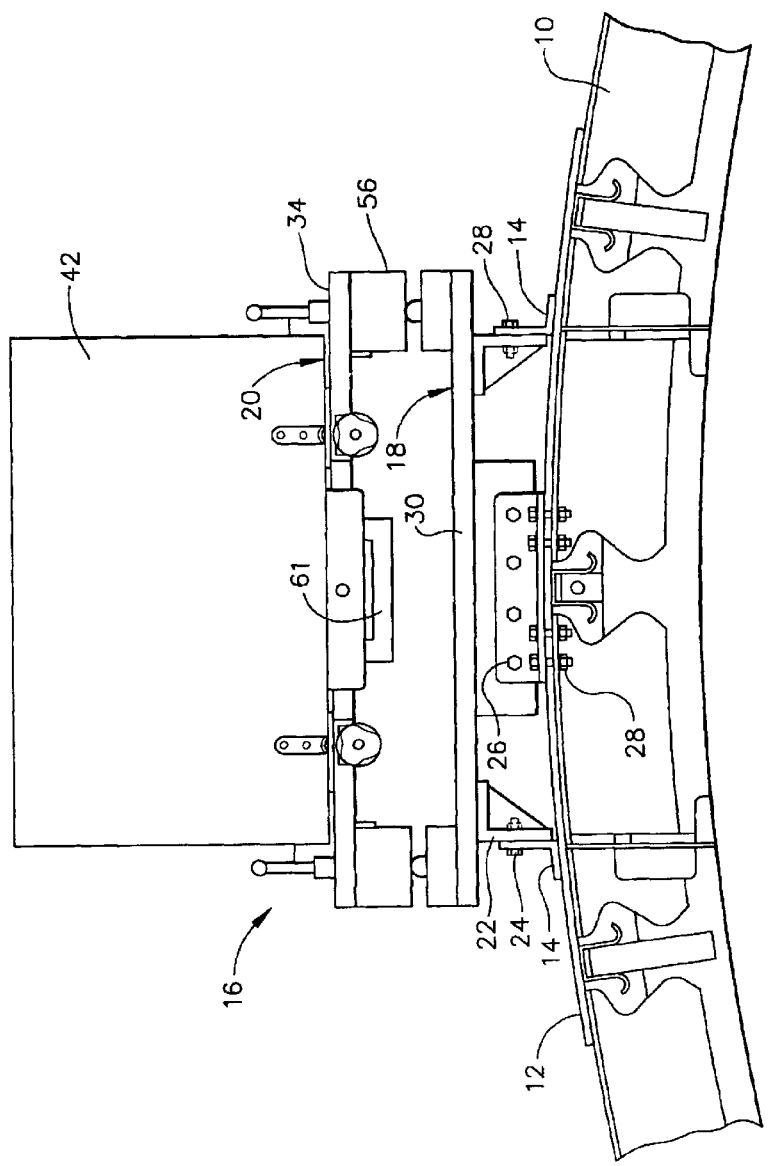
FIG. 2 is a front partial section view of the top of the fuselage showing details of an embodiment of the mounting of elements of the present invention.

Referring to the drawings, FIG. 1 shows the forward fuselage 10 of an aircraft on which auxiliary equipment is to be mounted. As an exemplary embodiment, the fuselage incorporates a radome adapter plate 12 for a next generation antenna (NGA). NGA mounting angles 14, to which the NGA will be mounted, are attached to the adapter plate or the top skin of the fuselage within the adapter plate footprint. As best seen in FIG. 2, a precision locating tool assembly 16 incorporates a common interface assembly 18 and an aircraft model-specific interface assembly 20. The common interface assembly has legs 22 which are attached to the mounting angles through precision indexing holes 24 adapted for alignment with mounting holes 26 in the mounting angles. Precision pins or mounting bolts 28 secure the common interface assembly to the mounting angles. A rigid surface plate 30 is attached to the legs as a reference surface for engagement with the model specific interface assembly.

Figure 3:
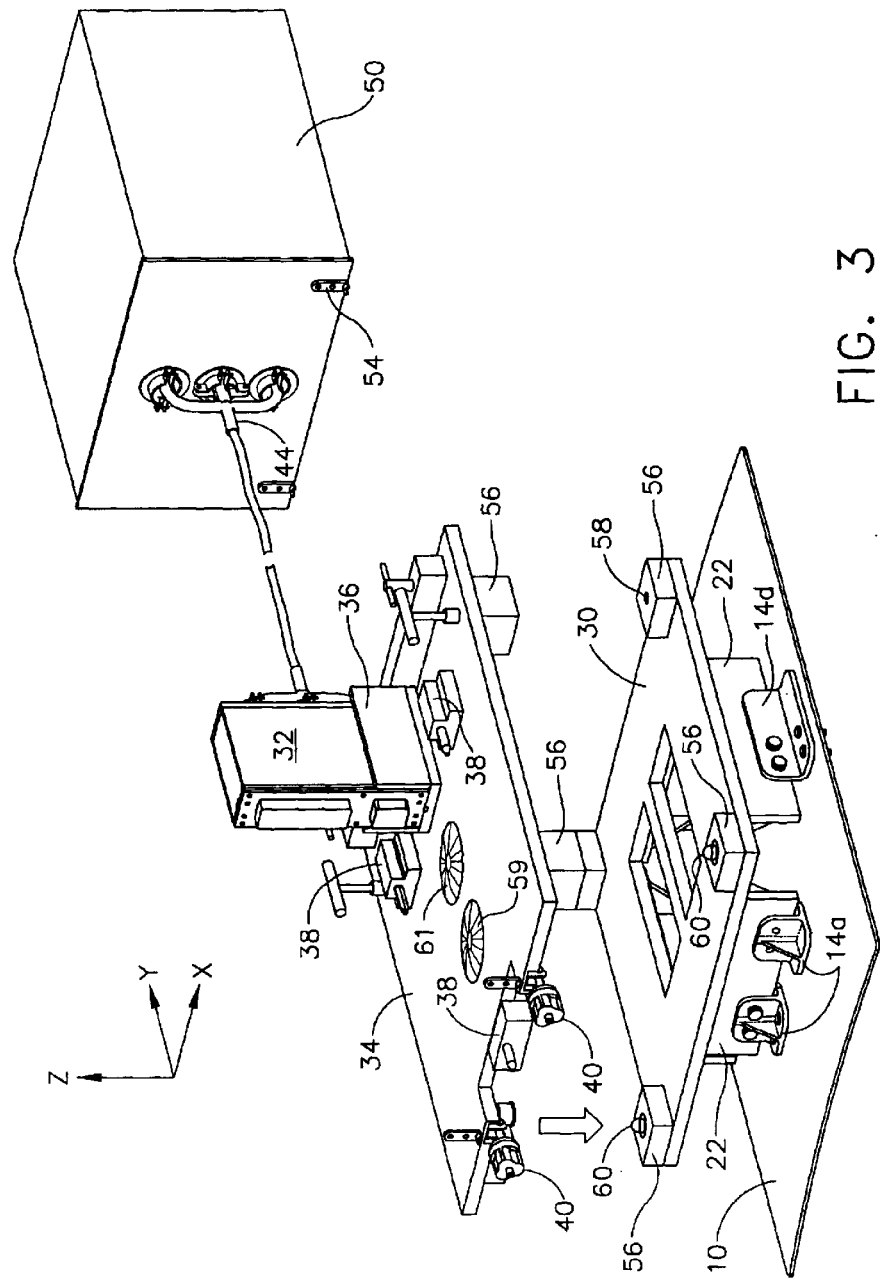
FIG. 3 is a front isometric exploded view of the elements of one embodiment of the invention.
Figure 4:
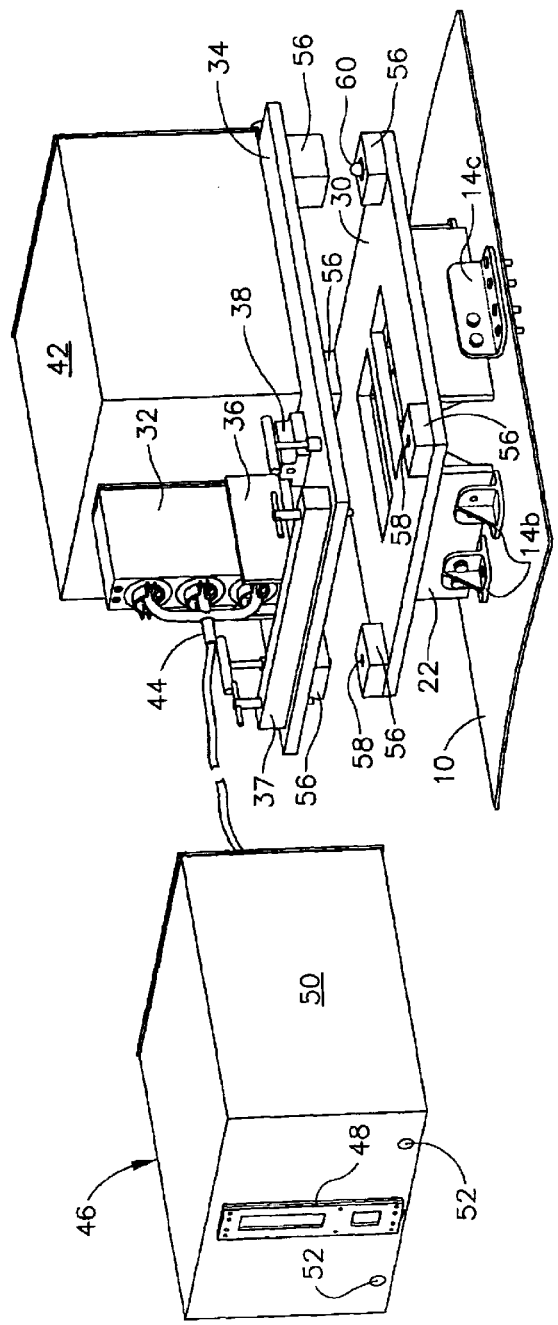
FIG. 4 is a rear isometric exploded view of the elements shown in FIG. 3.

As shown in the exploded views of the precision locating tool assembly looking aft in FIG. 3 and looking forward in FIG. 4, the common interface assembly is adapted for indexing to the attachment brackets for the type of auxiliary equipment to be mounted on the aircraft. For the embodiment shown, the attachment brackets constitute the mounting angles for the NGA including two forward angles 14a, two aft angles 14b and starboard and port angles 14c and 14d. In alternative, embodiments for other types of auxiliary equipment, various bracket arrangements or mounting holes in the fuselage structure are employed. A common interface assembly indexed to such mounting arrangements is employed for each particular auxiliary equipment configuration.

The aircraft model-specific interface assembly is adapted to receive the IRU for the particular aircraft on which the auxiliary equipment is being mounted. Guide pin assemblies 38 and quick disconnect fasteners 40 are mounted on the second surface plate of the model-specific interface assembly in conjunction with the connector to precisely receive and secure the IRU in a comparable manner to the IRU's mounting tray in the avionics bay or instrument panel of the aircraft. The IRU 42 is shown in phantom mounted to the model-specific interface assembly in FIG. 4. A connector block 32 such as an ARINC 600 connector common to IRU mounting trays in aircraft is connected to the IRU mounted on the model-specific interface assembly. The connector is supported on the model specific interface assembly by channel bracket 36. A backing bar 37 restrains the connector block in the channel bracket.

Connection cabling 44 extends from the connector block to an IRU simulator 46 having a mating connector 48 identical to the IRU and a box or frame 50 having interface holes 52 and quick disconnect attachments 54 simulating the IRU for mounting in the IRU mounting tray 55 in the aircraft, as shown in FIG. 1. The cable assembly including the connector block, cable and simulator with mating connector, when connected to the precision locating tool assembly and the aircraft IRU mounting tray, allows power to be provided to the IRU and data from the IRU to be read out on the aircraft displays.

The surface plate of the common interface assembly and the second surface plate in the model-specific interface assembly each support mating blocks 56 with indexing holes 58 to receive precision locating pins or balls 60 to precisely index and align the two interface assemblies. In certain embodiments, one or more of the locating pins is replaced with clamps or threaded fasteners for securing the surface plates. With the common interface assembly attached to the NGA mounting angles, the model-specific interface assembly mounted to the common interface assembly and the IRU mounted in the model-specific interface assembly, the IRU is rigidly positioned to precisely measure the attitude (pitch and roll) and heading of the NGA mounting angles and hence a mounted NGA. Comparison with the measured aircraft attitude and heading using the same IRU mounted in its mounting tray or a second IRU mounted in the aircraft with prior cross calibration, allows precise differential definition of the NGA attitude and heading for calibration/correction of the NGA. The dual IRU process allows simultaneous aircraft/antenna readings in case the aircraft is moved during alignment and is faster than the single IRU method.

To accommodate cooling requirements of the IRU, the model specific interface assembly includes one or more fans 61 mounted in cooling apertures 59 in the surface plate 34. For exemplary purposes, fan blades are shown in the apertures in the embodiment shown in the drawings. In alternative embodiments, box fans or other appropriate fan device are mounted under the surface plate in communication with the apertures 59.

The sequence of operation for the method of the invention on the exemplary NGA mounting can be characterized as follows.

1. The NGA mounting angles are installed on the aircraft per design requirements.

2. The common interface assembly is installed on the NGA mounting angles and the model-specific interface assembly is mounted to the common interface assembly.

3. The aircraft is stabilized to prevent movement and avionics power is provided.

4. The IRU is powered and the cockpit display is read to record attitude and heading of the installed IRU.

5. The IRU is powered down by removing power from the aircraft or using the IRU circuit breaker, removed from the mounting tray and installed on the precision locating tool assembly using the guide pins and quick disconnects. The connector block of the cable assembly is then mated to the IRU and restrained in place in the support channel with the backing bar.

6. The cable of the cable assembly is routed to the IRU mounting tray and the IRU simulator installed in the IRU mounting tray.

7. Power is restored to the IRU by powering the aircraft or resetting the IRU circuit breaker and use the cockpit display to record the attitude and heading on the IRU as installed on the precision locating tool assembly, thereby establishing the relative differential between the aircraft attitude and heading and the NGA mounting angles (and mounted NGA) attitude and heading.

8. The IRU is powered down, the cable assembly disconnected, the IRU removed from the precision locating tool assembly and the IRU reinstalled in the aircraft IRU mounting tray. For calibration verification, the IRU is powered up again and comparative aircraft attitude and heading readings are made.

Figure 5:
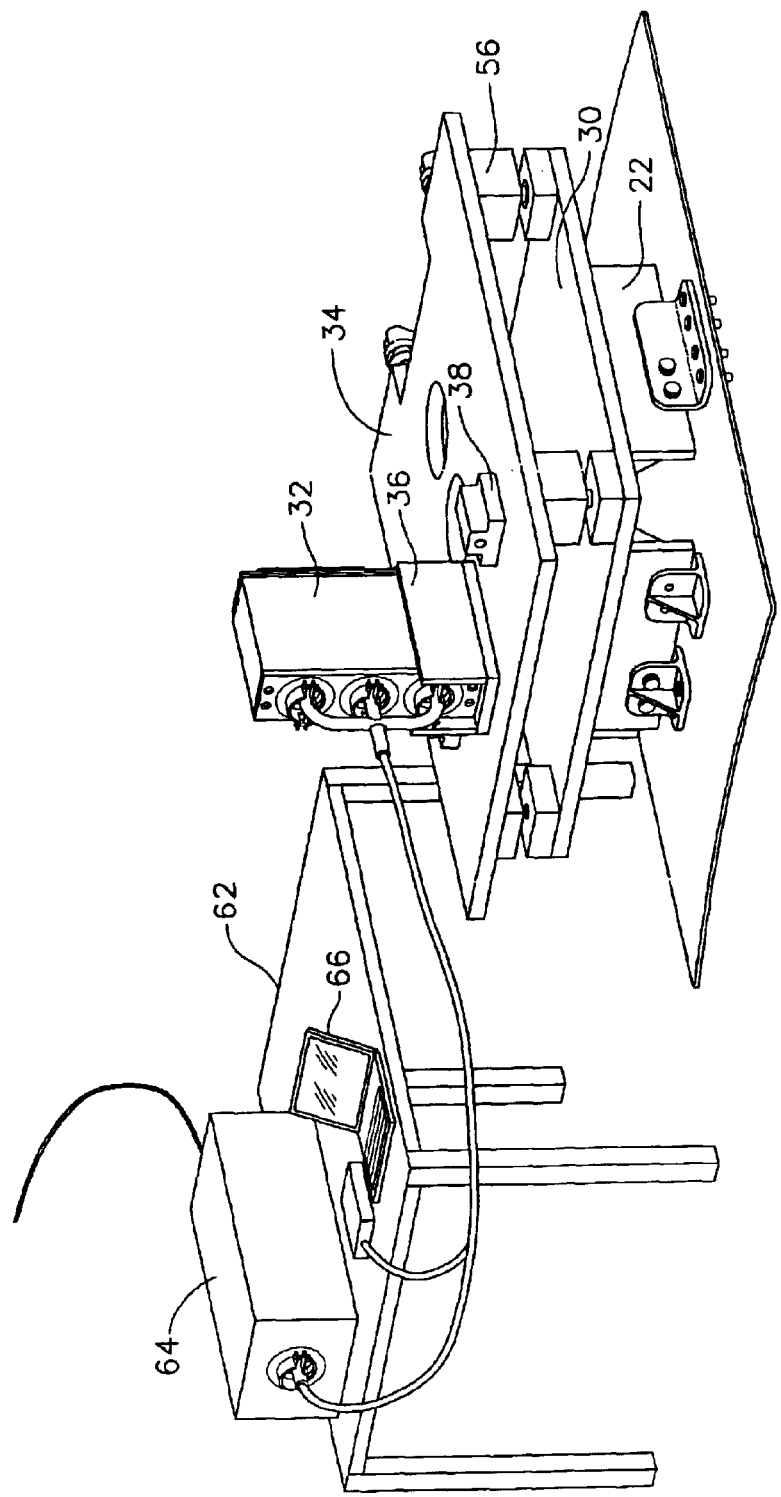
FIG. 5 is an isometric view of an alterative embodiment of the invention employing a remote power pack and instrument readout for the IRU mounted on the precision locating tool assembly.

In certain aircraft applications, the distance or difficulty in routing the cable assembly from the auxiliary equipment mounting location to the IRU mounting tray precludes the use of a cable assembly as defined in the prior embodiment. In an alternative embodiment, a powerpack and remote display assembly 62 is provided as shown in FIG. 5. The powerpack 64 provides conditioned power from a start cart or other ground power unit (not shown) or other power source such as a battery to the IRU through the connector block. The remote display 66 simulates the aircraft IRU cockpit display or otherwise displays the attitude and heading information generated by the IRU when mounted in the precision locating tool assembly. In certain embodiments, a portable computer is configured to act as the remote display. With appropriate software, the portable computer is employed to record the IRU data with manipulation to provide direct input into the auxiliary equipment system for correction/calibration.

In this embodiment the powerpack and remote display assembly is positioned near the precision locating tool assembly at the auxiliary equipment mounting location and steps 7 and 8 of the operational procedure are modified as follows.

7. Power is provided to the IRU through the power pack and the remote display is used to record the attitude and heading on the IRU as installed on the precision locating tool assembly, thereby establishing the relative differential between the aircraft attitude and heading and the NGA mounting angles (and mounted NGA) attitude and heading.

8. The powerpack is powered down removing power from the IRU, the IRU removed from the precision locating tool assembly and the IRU reinstalled in the aircraft IRU mounting tray. For calibration verification, the IRU is powered up again and comparative aircraft attitude and heading readings are made.

Having now described the invention in detail as required by the patent statutes, those skilled in the art will recognize modifications and substitutions to the specific embodiments disclosed herein. Such modifications are within the scope and intent of the present invention as defined in the following claims.

What is claimed is:

1. An aircraft auxiliary equipment precision alignment system comprising:
   an auxiliary equipment mount attached to the aircraft;
   an inertial reference unit (IRU) having means for removable attachment to an in-service avionics tray onboard the aircraft;
   a locating assembly having means for precision engagement with the auxiliary equipment mount, the locating assembly further having a mating means adapted to receive the IRU; and,
   a means for remote operation of the IRU.

2. An aircraft auxiliary equipment precision alignment system as defined in claim 1 wherein the means for remote operation comprises an extension cable assembly for operatively connecting the locating assembly to the avionics tray for remote operation of the IRU.

3. An aircraft auxiliary equipment precision alignment system as defined in claim 1 wherein the means for remote operation comprises a powerpack and remote display for the IRU connected to the locating assembly.

4. An aircraft auxiliary equipment precision alignment system as defined in claim 1 wherein the means for precision engagement comprises a common interface assembly having means for indexing to the auxiliary equipment mount and wherein the mating means comprises a model specific interface assembly having a connector block for electrical connection to the IRU and quick disconnect means for mechanical attachment of the IRU, the common interface assembly and model specific interface assembly having means for indexing and alignment.

5. An aircraft auxiliary equipment precision alignment system as defined in claim 4 wherein the auxiliary equipment mount comprises a plurality of brackets and the common interface assembly has a plurality of legs, equal in number to the plurality of brackets, each leg having first precision indexing holes for alignment with auxiliary equipment mounting holes in each respective bracket, the common interface assembly further having a surface plate attached to the legs and wherein the model specific interface assembly further comprises a second surface plate and the means for indexing and alignment comprises a second plurality of mating blocks extending from the surface plate opposite the legs and a third plurality of mating blocks, equal in number to and in spaced relation for engagement with the second plurality of mating blocks, extending from the second surface plate, the second surface plate further incorporating means to support the connector block opposite from the mating blocks.

6. An aircraft auxiliary equipment precision alignment system as defined in claim 5 wherein the means for indexing and alignment further comprises second precision indexing holes in each of second and third plurality of mating blocks and locating pins received in the second precision indexing holes.

7. An aircraft auxiliary equipment precision alignment system comprising:
   an auxiliary equipment mount having a plurality of brackets attached to the aircraft;
   an inertial reference unit (IRU) having an electrical connector and mechanical quick disconnect for removable attachment to an in-service avionics tray onboard the aircraft;
   a locating assembly having
      a common interface assembly including a plurality of legs, equal in number to the plurality of brackets, each leg having precision indexing holes for alignment with auxiliary equipment mounting holes in each respective bracket, the common interface assembly further having a surface plate attached to the legs,
      a model specific interface assembly having a second surface plate and quick disconnect means for mechanical attachment of the IRU mounted to the second surface plate,
      a second plurality of mating blocks extending from the surface plate opposite the legs and a third plurality of mating blocks, equal in number to and in spaced relation for engagement with the second plurality of mating blocks, extending from the second surface plate; and,
   a connector block for electrical connection to the IRU and a means for remote operation of the IRU.

8. An aircraft auxiliary equipment precision alignment system as defined in claim 7 wherein the means for remote operation comprises an extension cable assembly having a cable extending from the connector block and, mounted to the cable distal from the connector block, a simulator box having a connector substantially identical to the IRU for electrically mating to the in-service avionics tray and quick disconnect substantially identical to the IRU for mechanically mating to the in-service avionics tray for operatively connecting the locating assembly to the avionics tray for remote operation of the IRU.

9. An aircraft auxiliary equipment precision alignment system as defined in claim 7 wherein the means for remote operation comprises a powerpack and remote display for the IRU operably connected to the connector block of the model specific interface assembly.

10. An aircraft auxiliary equipment precision alignment system as defined in claim 1 further comprising a second IRU mounted in the aircraft for simultaneous operation during remote operation of the first IRU.

11. A method for precision alignment of auxiliary equipment on an aircraft comprising the steps of:
    attaching to the aircraft a mounting means intended for mounting the auxiliary equipment to the aircraft;
    mounting a locating tool to the mounting means;
    obtaining aircraft attitude and heading using an inertial reference unit (IRU);
    removing the IRU from an IRU avionics tray in the aircraft;
    installing the IRU on the locating tool; and,
    operating the IRU to obtain attitude and heading.

12. A method for precision alignment of auxiliary equipment on an aircraft as defined in claim 11 wherein the step of mounting a locating tool comprises the steps of:
    mounting a common interface assembly to the mounting means; and
    mounting a model specific interface assembly to the common interface assembly; and wherein the step of installing the IRU comprises installing the IRU on the model specific interface assembly.

13. A method for precision alignment of auxiliary equipment on an aircraft as defined in claim 11 wherein the step of operating the IRU further comprises the initial step of connecting the locating tool to the avionics tray for remote operation of the IRU.

14. A method for precision alignment of auxiliary equipment on an aircraft as defined in claim 11 wherein the step of operating the IRU further comprises the initial step of connecting a powerpack and remote display for the IRU to the locating assembly.

15. A method for precision alignment of auxiliary equipment on an aircraft as defined in claim 14 wherein the remote display comprises a portable computer.

16. A method for precision alignment of auxiliary equipment on an aircraft as defined in claim 11 further comprising the steps of:

comparing the aircraft attitude and heading using a second IRU mounted in the aircraft during the step obtaining the aircraft heading with the first IRU; and substantially simultaneously reading the aircraft attitude and heading with the second IRU while performing the step of operating the first IRU to obtain attitude and heading while mounted on the locating tool.

* * * * *